United States Patent [19]

Micheels et al.

[11] Patent Number: 4,989,059
[45] Date of Patent: Jan. 29, 1991

[54] SOLAR CELL WITH TRENCH THROUGH PN JUNCTION

[75] Inventors: Ronald H. Micheels, Concord; Percy Valdivia, Cambridge; Jack I. Hanoka, Brookline, all of Mass.

[73] Assignee: Mobil Solar Energy Corporation, Billerica, Mass.

[21] Appl. No.: 375,037

[22] Filed: Jun. 30, 1989

Related U.S. Application Data

[62] Division of Ser. No. 193,818, May 13, 1988, abandoned.

[51] Int. Cl.$^5$ ............................................. H01L 27/14
[52] U.S. Cl. ............................................ 357/30; 357/2; 357/55; 136/255; 437/65; 437/907; 437/908
[58] Field of Search ................. 357/30 J, 30 K, 2, 55; 136/255; 437/65, 907, 908

[56] References Cited

U.S. PATENT DOCUMENTS

| 3,411,952 | 11/1968 | Ross et al. | 357/30 J X |
| 4,046,594 | 9/1977 | Tarui et al. | 357/30 J X |
| 4,095,329 | 6/1978 | Ravi | 29/572 |
| 4,128,732 | 12/1978 | Kaplow et al. | 357/30 J X |
| 4,335,503 | 6/1982 | Evans, Jr. et al. | 357/30 J X |
| 4,608,451 | 8/1986 | Landis | 357/30 J X |

Primary Examiner—William Mintel
Attorney, Agent, or Firm—Schiller, Pandiscio & Kusmer

[57] ABSTRACT

A solar cell fabrication procedure is described in which a trench is cut in the substrate so as to electrically isolate front and back regions of a flat solar cell. The trench is preferably cut around the perimeter of the rear side of the cell. The trench is preferably formed by an excimer laser which may be used to ablate a trench without diffusing conductive material deeper into the cell.

13 Claims, 1 Drawing Sheet

SOLAR CELL WITH TRENCH THROUGH PN JUNCTION

This is a division of U.S. application Ser. No. 193818, filed May 13, 1988, now abandoned, of R.H. Micheels et al for "Method Of Fabricating Solar Cells".

FIELD OF THE INVENTION

This invention pertains to the manufacture of photovoltaic cells. More particularly, the invention relates to an improved method of electrically isolating the front side of a polycrystalline silicon solar cell from its rear side.

BACKGROUND OF THE INVENTION

Heretofore a common method of fabricating silicon solar cells has included the steps of: (1) diffusing phosphorus into P-type silicon ribbon so as to form a shallow junction, (2) forming on the junction side of the ribbon a thin coating of silicon nitride, (3) forming a grid electrode pattern in the silicon nitride coating by photolithography (e.g., using a suitable photoresist composition and etching), (4) coating the other side of the silicon ribbon with an aluminum paste, (5) heating the silicon so as to alloy the aluminum and silicon, (6) plating exposed silicon on the junction side and aluminum on the other side with nickel, (7) sintering the nickel to form a nickel silicide on the junction side, and (8) plating additional metal(s) onto the metal-covered portions of the silicon. An example of such a process can be found in U.S. Pat. No. 4,451,969.

In a typical diffusion-type junction-forming operation, diffusion occurs on all of the surfaces of the substrate. Thus, for example, when phosphorus is diffused into the P-type silicon ribbon from phosphosilicate glass to form a shallow junction, the junction and phosphosilicate glass will extend along the front and back sides of the cell as well as on the edges. The glass is removed by immersing the substrate in an etching solution Nevertheless, a continuous junction will exist around the cell (as viewed in cross-section) which will provide a low resistance current path between the front and rear sides of the solar cell. In some cases, current paths between the front and rear sides of the solar cell may also be created from metallic wrap-around of metal deposited on the substrate during the formation of an electrode.

In the past, the cell edges have been trimmed to conductively isolate the back of the cell from the front. Trimming has been done by mechanically sawing off edge portions of the cells. The saw cutting technique for trimming the edges is effective in isolating the front and back surfaces, but it is also wasteful. The trimmed cells are smaller and the material trimmed is generally discarded as waste. Unfortunately, safe disposal of silicon waste is both difficult and costly. It is costly not only in terms of material waste, but also in that the silicon must be disposed of within the guidelines established by the government pollution control authorities. Cell edges also have been trimmed by plasma-etching. The latter technique also has disadvantages.

It is recognized by persons skilled in the art that widespread use of photovoltaic solar cells is dependent upon the development of fabrication techniques capable of producing reliable solar cells with a conversion efficiency of 12% or higher at a relatively low cost. The cost and saleability of solar cells, like other semiconductor devices, depends on (1) the cost of the starting materials, (2) the cost of converting the starting materials into the finished product, (3) the cost of disposing of waste materials, (4) the overall output of the cells, and (5) the yield of acceptable solar cells.

OBJECTS OF THE INVENTION

Accordingly, the basic object of this invention is to provide an improved method of breaking the continuity of a diffused solar cell junction.

Another more extensive object of this invention to provide a low cost processing sequence for the fabrication of solar cells in which the front and back surfaces are conductively isolated without trimming of the cell.

An additional significant object of this invention is to provide a method of forming a trench in a solar cell without diffusing phosphorous, metals or another conductive material deeper into the solar cell.

Another object is to provide an improved low cost method of making photovoltaic semiconductor junction devices in which a trench is ablated in either the front or back surface of a substrate using an excimer laser so as to conductively isolate the front and back surfaces from each other.

An additional object of this invention is to provide an improved method of fabricating silicon solar cells which avoids the wasteful step of mechanically trimming the cell.

These and other objects of this invention are achieved by a solar cell fabrication method of the character described which involves the following steps: (A) providing a silicon substrate having a preformed PN junction adjacent the surfaces of said substrate; and (B) using an excimer laser to ablate a trench to conductively isolate an area of one surface of the substrate from the remaining surfaces of the substrate.

These and various other features and advantages of the invention are disclosed by the following detailed description of the invention and the accompanying drawings.

BRIEF DESCRIPTION OF THE DRAWINGS

For a fuller understanding of the nature and objects of the present invention, reference should be had to the following detailed description which is to be considered together with the accompanying drawing wherein.

Throughout the drawing, like reference numbers refer to similar structure.

Figure 1:
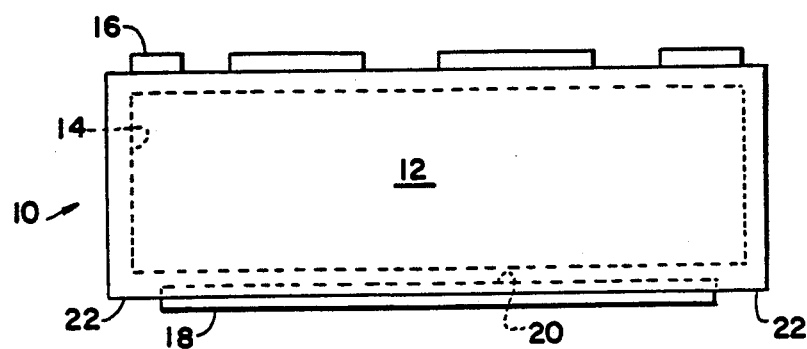
FIGS. 1 to 3 illustrate steps involved in making solar cells according to a preferred form of the invention.

In the drawing, the thicknesses and depths of the several coatings and regions are neither shown to scale nor shown exactly in accordance with their relative proportions, for convenience of illustration.

DETAILED DESCRIPTION OF THE INVENTION

It is to be noted that the invention is not limited to the preferred embodiment of the invention hereinafter described In other words, the invention may be practiced using a different method of making solar cells.

Referring now to the drawing, the preferred embodiment of the invention relates to the production of solar cells from EFG grown P-type silicon ribbon. For this embodiment, there is provided as a starting piece a partially finished cell 10 (FIG. 1). Partially finished cell 10 comprises a substrate 12, preferably formed from a P-type conductivity silicon ribbon, which has been processed so as to have a relatively shallow PN junction 14 (i.e., a junction that is between about 3,000 and about 7,000 Angstrom units deep). One side (hereinafter the "front side") of the substrate has a mask 16 formed of a selected material (e.g., a dielectric) to which metals, such as nickel, will only poorly adhere, and is configured to expose portions of the front surface of substrate 12 in a pattern of a multi-fingered grid electrode (e.g., an electrode having the form illustrated in U.S. Pat. No. 3,686,036). The other side (hereinafter the "rear side") of the substrate is preferably provided with a layer 18 of aluminum alloyed to the substrate so as to form a P+ region 20. The uncoated margin 22 of the rear surface extends completely around the periphery of the cell. The P+ region 20 preferably has a depth of from about 1 to about 5 microns.

Partially finished cell 10 may be fabricated by any of a number of means well known in the art. For instance, junction 14 may be formed in a P-type silicon substrate 12 by the diffusion of phosphorus, and mask 16 may consist of a coating of a suitable material that can function as an anti-reflection coating such as silicon dioxide or silicon nitride (preferably silicon nitride). Mask 16 may be formed by coating the entire front surface of the substrate with a layer of material such as silicon dioxide or silicon nitride, and then removing selected portions of the layer by photolithography. Layer 18 and P+ region 20 may be formed by coating the rear side of the substrate with a layer of an aluminum paste comprising an aluminum powder in an organic vehicle that can be removed by heating and/or pyrolysis, e.g., a mixture of terpineol and ethylcellulose, and then heating the substrate to remove any volatile or pyrolyzable organic components of the paste and to alloy the aluminum to the substrate and form the P+ region. However, other forms of the substrate, junction, and rear electrode, and other fabrication techniques, may equally well be employed to provide partially finished cell 10, e.g., formation of the front metallization pattern by thick film screen printing.

Figure 2:
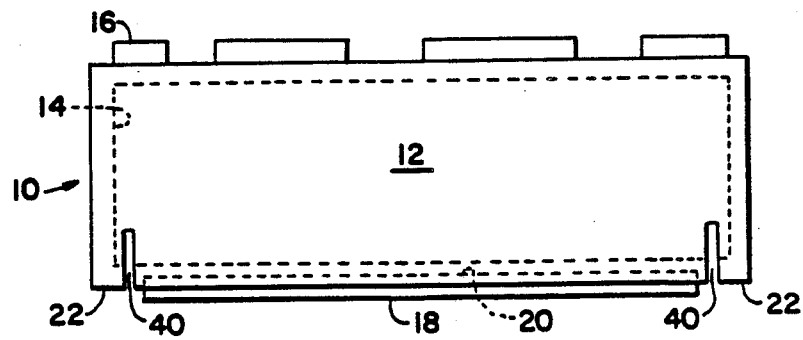

Starting with such a prefabricated piece, an excimer laser is used to ablate a trench 40 (FIG. 2) in the rear side of the substrate. The trench 40 extends completely around the perimeter of the rear side. It is preferable to form the trench on the rear side (rather than the front side) of the cell to avoid producing any dead cell area on the front side, which is the critical energy-collecting surface of the cell. The trench 40 extends to a depth sufficient to penetrate the PN junction 14. However, the depth of trench 40 should not be so great as to weaken the substrate. A trench depth of 10-25 microns has been found acceptable. Trench 40 thus serves to conductively isolate the rear side of the substrate from the front side.

The term "excimer laser" is meant to describe the family of pulsed high-pressure gas lasers which emit powerful pulses lasting nanoseconds in the ultraviolet spectral region in the range of approximately 193 to 351 nm. The term "excimer" is used in a broad sense to describe any rare gas-halogen or halogen molecule in which the component atoms are bound in the excited state but not in the ground state. It is this property that makes them good laser materials with desirable output characteristics.

The laser's gas mixture is typically at a total pressure below about 5 atmospheres. It typically contains a small concentration of a halogen (chlorine or fluorine) and a rare gas (argon, krypton or xenon) in a buffer of helium or neon. The buffer gas usually comprises 88% to 99% of the gas mixture. Upon excitation the halogen and rare gas atoms combine to form a rare gas halide molecule which emits pulses at a discrete wavelength in the ultraviolet.

Rare gas halides which exhibit the most intense output are ArF (193 nm), KrF (248 nm), XeCl (308 nm) and XeF (351 nm). Single-pulse energies from these species are typically between 0.1 and 1.0 Joule. The average power produced by an excimer laser is limited by its pulse repetition frequency (PRF). The average pulse power (in watts) equals the pulse energy (in joules) times the number of pulses per second (hertz). Most commercial excimer lasers produce a few tens of watts average power.

It is contemplated that ablating trench 40 may be accomplished by operating an excimer laser at a wavelength characteristic of one of the rare gas halides (i.e., ArF, KrF, XeCl and XeF), energies between 0.1 and 1.0 Joules, and pulse repetition rates less than 80 hertz. The laser's beam may be focused into a line 0.05 × 50 mm so as to cut part or all of the trench along one side of the cell. Where the length of the cell is longer than the beam length, the cell may be moved relative to the laser by suitable translating and moving means (e.g., an x-y table) to cut a trench in multiple steps. Cutting may be accomplished at rates of 6 to 10 inches per minute.

It is also contemplated that the invention may be used with a substrate support that combines the translational movement capability of an x-y table with the rotary motion capability of an indexing rotary table, so that the trenching may involve (a) cutting a trench along one side of a rectangular or square solar cell, (b) rotating the solar cell 90 degrees to expose a new side of the solar cell, (c) cutting a trench along the new exposed side of the cell, and (d) repeating steps (a) and (b) until each side of the cell is cut, thereby forming a continuous trench 40 (FIGS. 2 and 3) around the perimeter of the rear side of the solar cell.

It is critical to use an excimer laser rather than the infrared radiation from, for example, Nd:YAG and $CO_2$ lasers, because the larger wavelengths will cause the phosphorus (and/or any metal film present) to diffuse deeper into the cell rather than being vaporized and cleanly removed. The high energy photons from excimer lasers typically interact with the electronic excitation levels of an absorber and this leads to direct chemical bond breaking and vaporization.

Following is a specific example of the preferred mode of practicing the invention.

EXAMPLE

A silicon ribbon of P-type conductivity made by the EFG process and having a conductivity of about 56 ohm-cm. is cleaned by etching it in a solution of $HNO_3$:HF (1:1) for about 3 minutes at a temperature of about 25° C. Thereafter the ribbon is subjected to junction formation. This is accomplished by placing the ribbon in a diffusion furnace and exposing it therein to a continuous flow of an atmosphere comprising oxygen, nitrogen and phosphine ($PH_3$) at a temperature of about 900° C. for a period of approximately 30 minutes. Thereafter, the flow of phosphine is terminated and the furnace is allowed to cool in an air (oxygen and nitrogen) atmosphere to a temperature of about 650° C. over a period of about 1.5 hours, after which it is removed from the furnace. At this point, a shallow junction (3000-7000 Angstrom units deep) as shown at 14 in FIG. 1 has been formed in the substrate.

In the diffusion furnace, a number of reactions occur, including the following:

$$P_2O_5(g) + SiO_2(s) \rightarrow (P_2O_5)_x(SiO_2)_y(s)$$

where (g) and (s) indicate gaseous and solid states respectively.

The $(P_2O_5)_x(SiO_2)_y$, a phosphosilicate glass, is removed from all surfaces of the ribbon by submerging the latter in a buffered HF acid solution, e.g., $10NH_4F(40\%):1$ HF, for a period of about 2 minutes.

Thereafter the ribbon is placed in a plasma reaction chamber and its front side is exposed for a period of between 3 to 4 minutes to a mixture of nitrogen, ammonia and silane gases which are passed through the reaction chamber and subjected at a selected temperature of at least 200° C. to a selected electrical voltage, whereby the reactive species of those gases react to produce and deposit on the front side of the ribbon a silicon nitride coating of about 1000 Angstrom units (see U.S. Pat. No. 4,451,969).

Thereafter a layer of a negative photoresist is applied over the silicon nitride coating. This photoresist layer is then covered with a mask in the pattern of a multi-fingered grid electrode, e.g., an electrode having the form illustrated in U.S. Pat. No. 3,686,036. The grid mask is then irradiated with ultraviolet light for approximately 5 to 7 seconds so as to cause the illuminated portion of the resist to polymerize. The photoresist is then developed by contact with toluene and propanol or other suitable chemicals. This development process removes those portions of the resist which have not been irradiated and hence have not polymerized.

After development of the resist, the ribbon is subjected to a buffered oxide etch consisting of a solution of HF and $NH_4F$. The etchant etches away the nitride on those portions of the front surface of the ribbon from which the resist has been removed.

Thereafter the residual resist is removed. This may be accomplished in various ways, e.g. by pyrolysis or dissolution.

After removal of the residual resist, the back side of the ribbon is coated with an aluminum paste consisting of minute aluminum particles in a volatile and/or pyrolyzable organic vehicle, preferably a vehicle comprising a mixture of terpineol and ethylcellulose. The paste is applied as a relatively thin layer to within about 1/10th of an inch from the edge of the substrate. Since the aluminum is applied in the form of paste, the area that is covered by the aluminum paste can be carefully controlled to produce a peripheral margin of predetermined width. Then the substrate is subjected to heating at a temperature of about 600 degrees C. for about 1.0 minute to remove the organic component of the aluminum paste and alloy the remaining aluminum to the silicon. During this alloying step the N-type region at the rear side of the ribbon is converted to a P+ region. At the end of the alloying step, the silicon ribbon has an adherent aluminum layer with a thickness of about 1-3 microns in contact with a P+ region as shown at 20 in the drawings.

Thereafter, both sides of the silicon ribbon are coated with a layer of nickel, e.g., in accordance with the method described in said U.S. Pat. No. 4,321,283. Thereafter the ribbon is subjected to sintering in a furnace at a temperature of about 300 degrees C. in a nitrogen atmosphere for a period of about 25 minutes, whereby nickel on the front side of the ribbon reacts with the adjacent exposed silicon to form a nickel silicide ohmic contact and nickel on the back side forms an alloy with the underlying aluminum layer. It is to be noted that no nickel layer is deposited on the silicon nitride remaining on the front side of the ribbon.

The ribbon is then immersed in an etching solution consisting of $HNO_3$ and kept there for a period of approximately 1-2 minutes so as to remove excess nickel from both sides of the ribbon. On removal from this bath the nickel on the front side of the ribbon is essentially in the for of a nickel silicide.

After removal from the nickel etchant the ribbon is again subjected to ultrasonic cleaning in water to remove all residues.

Thereafter, further metallization is conducted. Preferably this involves forming a layer of electroless copper on the metallized portions of the two sides of the ribbon. This is followed by a second layer of electrolytically deposited copper applied to the metallized portions of both sides of the ribbon.

It is to be noted that the front contact finger pattern can be formed by screen printing of a silver ink in place of deposition of nickel.

A trench 40 is then ablated through the rear side of the solar cell in that area around the periphery that is not covered by aluminum by focusing excimer laser beams which emit at 248 nm. The wavelength results from using krypton fluoride (KrF) as the lasing medium. The pulse energy is less than 0.75 Joules and the number of pulses per second is less than 80 hertz. The laser is focused into a line approximately $0.05 \times 50$ mm and the trench is cut 10-25 microns deep in order to cleanly isolate the junction layer.

Figure 3:
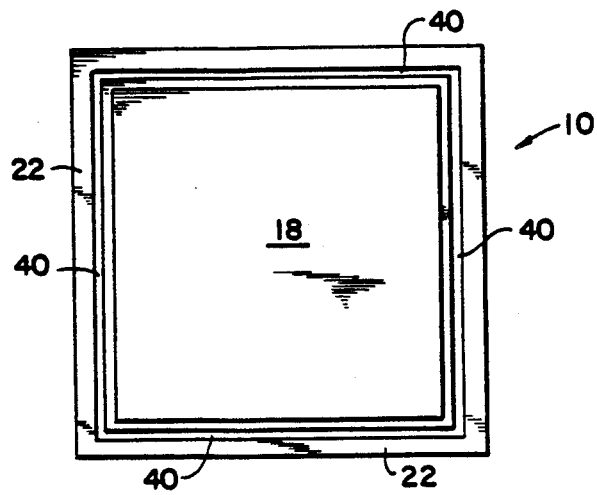

The trenching is accomplished using an indexing rotary table and involves (a) cutting along one side of the cell, (b) rotating the cell 90 degrees to expose a new side of the cell, (c) cutting the newly exposed side of the cell and (d) repeating steps (b) and (c) until each side of the cell is cut thereby forming a continuous trench along the perimeter of the rear surface. As seen in FIG. 3, the trench 40 defines a rectangle surrounding the rectangular aluminum electrode 18.

The proper laser energy is critical in this process because excessive energy will cause phosphorus in the substrate to diffuse deeper into the cell. As stated above, it is important that the trench be deep enough to completely penetrate P+ region 20 so that the front side of the cell is conductively isolated from the rear side.

Thereafter the finished cell is dipped in a solder bath comprising 60% tin, 40% lead so as to apply a solder layer over the copper coatings.

It is to be appreciated that the invention is susceptible to a number of obvious modifications. Thus as an optional measure, the trenching technique can be accomplished immediately following the alloying of the aluminum electrode on the rear side of the cell. As still another option, the trenching technique may be accomplished before the aluminum is deposited or before any front metallization is accomplished. A particularly interesting option is to use the trenching technique before front metallization in the case where the front contact is produced by a screen printing process. Another option is to apply the trenching technique immediately after diffusion of phosphorous into the cell.

Also, the isolation using the excimer laser can be conducted on either the front side or the rear side of the cell. However, as stated above, it is preferable to ablate a trench on the rear side of the cell to avoid producing any dead cell area on the front side and thus reduce the overall energy collecting surface of the cell.

Additionally, it is to be appreciated that the invention applies to the case where the solar cell is formed with a wrap-around contact. In such case an isolating trench is formed on the backside of the cell, in order to separate the bus bar (which is now on the back side) from the back contact. This modification helps to increase the available energy-collecting space on the energy-collecting surface.

Further, by way of example but not limitation, the wavelength of the excimer laser may be some value other than 248 nm, so long as it is within the range of 193 to 351 nm. Another preferred wavelength is 308 nm.

It is to be appreciated also that use of the invention is not limited to cells made according to a particular junction-forming technique or to a particular method of forming the metal electrodes, or to a particular metal composition for the front and back electrodes. Also while it is preferred that mask 16 be silicon nitride, the mask may have some other composition. The grid electrode also may be formed by a different method and made of a different metal, e.g., it may be a silver electrode and may be formed by a screen printing process.

It is to be noted also that the invention is not limited to cells made of EFG-grown silicon, and while it is preferred that the silicon substrate 12 be rectangular, it may have some other shape, e.g., a circular configuration.

Still other modifications are obvious to persons skilled in the art.

Since these and other changes in the method may be made without departing from the scope of the invention herein involved, it is intended that all matter contained in the above description or shown in the accompanying drawing shall be interpreted as illustrative. The present invention is indicated by the broad general meaning of the terms in which the appended claims are expressed.

What is claimed is:

1. A solid state semiconductor device formed by a method comprising the steps of:
   (a) providing a silicon substrate having a front surface, a rear surface, and opposite side edge surfaces, and a preformed PN junction adjacent all of said surfaces; and
   (b) using an excimer laser to ablate a trench through said PN junction along one of said front and rear surfaces so as to electrically isolate the junction at said front surface from the junction at said rear surface.

2. The device of claim 1 in which said trench is ablated along the perimeter of said front surface.

3. The device of claim 1 in which said trench is ablated along the perimeter of said back surface.

4. The device of claim 1 in which said solid state semiconductor device is a photovoltaic cell.

5. The device of claim 1 in which said trench is formed using a laser with a wavelength between about 193 and about 351 nm.

6. The device of claim 1 in which said trench is approximately 10-25 microns deep.

7. The device of claim 1 in which said substrate further includes ohmic contacts formed on said front and back surfaces.

8. The device of claim 7 in which said substrate further includes a conductive metal coating one of said ohmic contacts.

9. The device of claim 7 in which said ohmic contact formed on the back surface is aluminum and said trench is ablated in said rear surface in an area not covered by said aluminum.

10. The device of claim 1 in which said laser is an excimer laser having a wavelength of approximately 248 nm.

11. The device of claim 1 in which step (b) further comprises:
   ablating a trench along one side edge of said substrate;
   rotating said substrate 90 degrees to expose a new side edge of said substrate;
   ablating a trench along said new side edge; and
   repeating said rotating and ablating steps so as to ablate a trench along each other side edge of said substrate, whereby to electrically isolate the back surface region of said substrate from the remaining surface region of said substrate.

12. The device of claim 11 in which said substrate is translated to permit multiple trench-forming steps along each side of said substrate.

13. The device of claim 1 in which said laser is an excimer laser having a wavelength of approximately 308 nm.

* * * * *